(12) United States Patent
Zhang

(10) Patent No.: US 11,150,034 B2
(45) Date of Patent: Oct. 19, 2021

(54) WATER-COOLING RADIATOR

(71) Applicant: Dongguan Bingdian Intelligent Science & Technology Co., Ltd., Dongguan (CN)

(72) Inventor: Fengqi Zhang, Inner Mongolia (CN)

(73) Assignee: DONGGUAN BINGDIAN INTELLIGENT SCIENCE & TECHNOLOGY CO., LTD., Dongguan (CN)

( * ) Notice: Subject to any disclaimer, the term of this patent is extended or adjusted under 35 U.S.C. 154(b) by 166 days.

(21) Appl. No.: 16/663,349

(22) Filed: Oct. 25, 2019

(65) Prior Publication Data

US 2020/0056848 A1 Feb. 20, 2020

(30) Foreign Application Priority Data

Jul. 4, 2019 (CN) .......................... 201910601021.1

(51) Int. Cl.
*F28F 3/04* (2006.01)
*F28F 9/26* (2006.01)

(52) U.S. Cl.
CPC .............. *F28F 3/048* (2013.01); *F28F 9/262* (2013.01); *F28F 2250/08* (2013.01)

(58) Field of Classification Search
CPC .......... H05K 7/20218; H05K 7/20254; H05K 7/20272; H05K 7/20263; H05K 7/20327; H05K 7/20927; H05K 7/20936; H01L 23/473; F28F 9/0256; F28F 9/0258; F28D 2021/0031
See application file for complete search history.

(56) References Cited

U.S. PATENT DOCUMENTS

| | | | | | |
|---|---|---|---|---|---|
| 4,368,448 | A | * | 1/1983 | Kobayashi | H01L 23/473 165/134.1 |
| 4,887,849 | A | * | 12/1989 | Brief | F16L 37/098 285/91 |
| 4,991,876 | A | * | 2/1991 | Mulvey | E03C 1/025 285/21.1 |
| 5,964,206 | A | * | 10/1999 | White | F02M 37/0058 123/541 |
| 7,007,506 | B2 | * | 3/2006 | Kubo | F28D 15/0266 165/170 |
| 7,055,341 | B2 | * | 6/2006 | Nori | H01L 23/427 165/80.4 |

(Continued)

Primary Examiner — Jianying C Atkisson
Assistant Examiner — Jose O Class-Quinones

(57) ABSTRACT

A water-cooling radiator is disclosed, comprising a heat adsorption unit and a heat radiation unit, wherein the heat adsorption unit comprises an outer shell, a bottom shell, a water path cover plate and a heat adsorption soleplate which are successively connected from top to bottom; a liquid inlet pipe and a liquid outlet pipe both communicated with the heat radiation unit are arranged on the bottom shell, and a pump is arranged between the heat radiation unit and the liquid inlet pipe; a third water cavity is defined by the heat adsorption soleplate and the water path cover plate, a heat sink set arranged in the third water cavity and a first water passage hole extending in a direction perpendicular to the lengthwise direction of the heat sink set. The novel water-cooling radiator of the disclosed can improve the heat radiation effect, and facilitate for mounting, connecting, and maintaining.

8 Claims, 6 Drawing Sheets

(56) References Cited

U.S. PATENT DOCUMENTS

| | | | | |
|---|---|---|---|---|
| 7,143,816 B1* | 12/2006 | Ghosh | | H01L 23/473 165/80.4 |
| 7,404,433 B1* | 7/2008 | Hu | | H01L 23/473 165/104.33 |
| 7,450,386 B2* | 11/2008 | Silverstein | | F28D 15/0266 165/104.26 |
| 9,907,207 B1* | 2/2018 | Wu | | H05K 7/20272 |
| 2003/0200762 A1* | 10/2003 | Nakano | | F25B 39/02 62/259.2 |
| 2003/0214786 A1* | 11/2003 | Niwatsukino | | H01L 23/473 361/699 |
| 2004/0066625 A1* | 4/2004 | Meyer | | F28F 3/12 361/699 |
| 2004/0069451 A1* | 4/2004 | Meyer | | H01L 23/473 165/80.2 |
| 2005/0098305 A1* | 5/2005 | Lee | | G06F 1/20 165/104.33 |
| 2005/0185378 A1* | 8/2005 | Tilton | | H05K 7/20345 361/699 |
| 2006/0118279 A1* | 6/2006 | Stafford | | H01L 23/473 165/104.33 |
| 2006/0137860 A1* | 6/2006 | Prasher | | F28D 15/0266 165/104.33 |
| 2006/0264073 A1* | 11/2006 | Yang | | H01L 23/473 439/72 |
| 2006/0291165 A1* | 12/2006 | Flesch | | H01L 23/473 361/699 |
| 2007/0012423 A1* | 1/2007 | Kinoshita | | H01L 23/473 165/80.4 |
| 2007/0050980 A1* | 3/2007 | Vetter | | B23K 11/14 29/890.043 |
| 2007/0062673 A1* | 3/2007 | Olesen | | F28F 9/0268 165/80.4 |
| 2007/0074849 A1* | 4/2007 | Joshi | | H01L 23/473 165/80.3 |
| 2007/0076374 A1* | 4/2007 | Mongia | | H01L 23/473 361/699 |
| 2007/0090643 A1* | 4/2007 | Cheng | | F16L 33/03 285/190 |
| 2007/0125526 A1* | 6/2007 | Satou | | H01L 23/473 165/121 |
| 2007/0175610 A1* | 8/2007 | Yeh | | H01L 23/473 165/80.4 |
| 2007/0190685 A1* | 8/2007 | Ebbutt | | H01L 25/16 438/106 |
| 2007/0246205 A1* | 10/2007 | Lee | | F28F 3/048 165/170 |
| 2008/0179044 A1* | 7/2008 | Hu | | H01L 23/473 165/80.4 |
| 2008/0264604 A1* | 10/2008 | Campbell | | F28F 3/12 165/80.4 |
| 2009/0101316 A1* | 4/2009 | Han | | H01L 23/473 165/104.33 |
| 2009/0133852 A1* | 5/2009 | Ogiro | | H01L 23/473 165/80.3 |
| 2010/0033932 A1* | 2/2010 | Thome | | H01L 23/473 361/699 |
| 2010/0296249 A1* | 11/2010 | Li | | G06F 1/20 361/700 |
| 2012/0267074 A1* | 10/2012 | Nishi | | H01L 23/473 165/104.19 |
| 2013/0068424 A1* | 3/2013 | Hwang | | F28F 3/02 165/104.19 |
| 2015/0359141 A1* | 12/2015 | Fukuzono | | H01L 23/473 361/699 |
| 2016/0113153 A1* | 4/2016 | Liu | | H05K 7/20781 165/104.33 |
| 2016/0341342 A1* | 11/2016 | Arvelo | | H05K 7/20772 |
| 2016/0363967 A1* | 12/2016 | Tsai | | H05K 7/20272 |
| 2017/0045300 A1* | 2/2017 | Boday | | H01L 23/4735 |
| 2017/0045307 A1* | 2/2017 | Tsai | | H01L 23/467 |
| 2017/0332522 A1* | 11/2017 | Ushijima | | H05K 7/20281 |
| 2018/0204784 A1* | 7/2018 | Kawase | | H01L 25/18 |
| 2018/0269131 A1* | 9/2018 | Na | | H05K 7/20263 |
| 2018/0343771 A1* | 11/2018 | Wei | | F28F 9/26 |
| 2019/0116694 A1* | 4/2019 | Lyon | | H05K 7/20781 |

\* cited by examiner

WATER-COOLING RADIATOR

BACKGROUND OF THE INVENTION

The present invention relates to the field of water-cooling heat radiation, and in particular to a novel water-cooling radiator.

At present, with the rapid development of the electronic science and technology and people's needs in life, entertainment and work, computers have become an essential daily necessity in people's life. Nowadays, people cannot live without computers either for entertainment or for work in most cases. However, with the rapid development of the electronic technology, the performance of the computers has also improved rapidly. The improvement of performance is accompanied by the increase of calorific value, which has serious influences on the performance and service life of the computers.

Existing heat radiation systems mainly include air-cooling heat radiation systems and water-cooling heat radiation systems. The water-cooling heat radiation systems have been widely applied to the heat radiation of CPUs due to their remarkable heat radiation performance and low noise, and thus have become one of the important development trends of the cooling systems for computers.

However, since the water-cooling heat radiation systems in the prior art have a single water path design, the contact area between the cooling liquid and the heat radiation device in the water-cooling heat radiation systems is small, so that it is likely to result in poor heat radiation effect and low heat radiation efficiency. Moreover, in existing water-cooling radiators, a pump is arranged inside the device, so it is very inconvenient for mounting and maintenance.

BRIEF SUMMARY OF THE INVENTION

In order to solve the above problems, the present invention provides a novel water-cooling radiator, which ensures that the cooling liquid can come into contact with multiple heat sinks in a heat sink set to the greatest extent, increases the contact area of the cooling liquid with the heat sink set and improves the heat radiation effect. Moreover, a pump in the present application is externally connected, so it is more convenient to mount and connect, the performance is more excellent, and it is more convenient for maintenance.

To achieve that above objects, the present invention employs the following technical solutions. A novel water-cooling radiator is provided, including a heat adsorption unit connected to a heat radiation surface of a processor and a heat radiation unit communicated with the heat adsorption unit, wherein the heat adsorption unit includes an outer shell, a bottom shell, a water path cover plate and a heat adsorption soleplate which are successively connected from top to bottom; a liquid inlet pipe and a liquid outlet pipe both communicated with the heat radiation unit are arranged on the bottom shell, and a pump is arranged between the heat radiation unit and the liquid inlet pipe; a first water cavity connected to the liquid inlet pipe and a second water cavity communicated with the liquid outlet pipe are defined by the bottom shell and the water path cover plate, and the first water cavity and the second water cavity are independent from each other; a third water cavity is defined by the heat adsorption soleplate and the water path cover plate; a heat sink set is fixedly arranged on a surface of the heat adsorption soleplate within the third water cavity; a first water passage hole for communicating the first water cavity with the third water cavity and second water passage holes for communicating the second water cavity with the third water cavity are formed on a surface of the water path cover plate; and, the first water passage hole extends in a direction perpendicular to a lengthwise direction of the heat sink set, and the second water passage holes on the water path cover plate are formed at positions corresponding to two ends of the heat sink set.

Further, a liquid inlet is formed at a junction of the liquid inlet pipe with the first water cavity, and a liquid outlet is formed at a junction of the liquid inlet pipe with the second water cavity.

Further, a water passage groove is arranged on the bottom of the bottom shell, and a U-shaped water partition plate is arranged in the water passage groove; the first water cavity is defined by an inner wall of the water passage groove, an inner side face of the water partition plate and the water path cover plate; and, the second water cavity is defined by the inner wall of the water passage groove, an outer side face of the water partition plate and the water path cover plate.

Further, a limiting bump is arranged on an inner wall of the water passage groove, and a limiting groove corresponding to the limiting bump is formed on an outer side face of the water path cover plate; the water path cover plate is arranged in the water passage groove, and the limiting bump is inserted into the limiting groove. Further, a placement groove is formed on a bottom surface of the water path cover plate, the heat adsorption soleplate is arranged on the bottom plate of the water path cover plate, and the heat sink set is arranged in the placement groove; and, the first passage hole is formed in the middle of the bottom of the placement groove and communicated with the first water cavity, and the second passage holes are formed on two sides of the bottom of the placement groove and communicated with the second water cavity.

Further, the depth of the placement groove is equal to the height of the heat sink set.

Further, a circular seal groove is formed at a junction of the bottom shell with the heat adsorption soleplate, a seal ring is embedded in the seal groove, and the seal ring has a cross-sectional area larger than that of the seal groove.

Further, the heat adsorption unit further includes an arc-shaped bracket; clamp hooks are arranged at two ends of the arc-shaped bracket; a circle of first bosses are formed on an outer side face of the bottom shell, and a plurality of second bosses located below the first bosses are circumferentially arranged at uniform intervals on the outer side face of the bottom shell; clamp grooves corresponding to the clamp hooks are formed on the outer side face of the bottom shell between the first bosses and the second bosses; and, the arc-shaped bracket is clamped between the first bosses and the second bosses and connected to the bottom shell through the hooking connection of the clamp hooks at two ends with the clamp grooves.

Further, the heat radiation unit includes a heat radiation water manifold, a first adapter, a second adapter, a first pipe sleeve, a second pipe sleeve, a first braided pipe and a second braided pipe; the liquid outlet pipe is communicated with the first adapter, the first adapter is communicated with one end of the first braided pipe through the first pipe sleeve, and the other end of the first braided pipe is communicated with the heat radiation water manifold; and, the liquid inlet pipe is communicated with the second adapter, the second adapter is communicated with one end of the second braided pipe through the second pipe sleeve, the other end of the second braided pipe is communicated with a water outlet end of the pump, and a water inlet end of the pump is communicated with the heat radiation water manifold.

Further, the water-cooling radiator further includes a pump cover which includes an upper cover and a lower cover; the pump is located in a cavity defined by the upper cover and the lower cover; and, the second braided pipe passes through the cavity to be communicated with the heat radiation water manifold.

The present invention has the following beneficial effects.

1. When the cooling liquid enters the first water cavity from the liquid inlet pipe and then enters the third water cavity through the first water passage hole, and since the heat sink set is arranged in the third water cavity and the first water passage hole extends in a direction perpendicular to the lengthwise direction of the heat sink set, the cooling liquid will enter gaps between multiple heat sinks in the heat sink set and then flow to two ends along the lengthwise direction of the heat sink set, subsequently flow into the second water cavity through the second water passage holes, and then flow to the heat radiation unit through the liquid outlet pipe so as to realize water circulation. Therefore, it is ensured that the cooling liquid can come into contact with multiple heat sinks in the heat sink set to the greatest extent, so that the contact area of the cooling liquid with the heat sink set is increased and the heat radiation effect is improved. Meanwhile, since the circulation process of water is from the first water cavity to the third water cavity and then to the second water cavity and the whole water path is first from top to bottom and then from bottom to top, the liquid level of the cooling liquid is certainly higher than the height of the heat sink set to realize water circulation. Therefore, it can be ensured that the cooling liquid completely comes into contact with the heat sink set, and the heat radiation effect can be improved.

2. In the present application, the pump is arranged between the heat radiation unit and the liquid inlet pipe. Compared with the conventional pump internally arranged in the heat radiation unit, the pump in the present application is externally connected, so it is more convenient to mount and connect, the performance is more excellent, and it is more convenient for maintenance.

Figure 1:
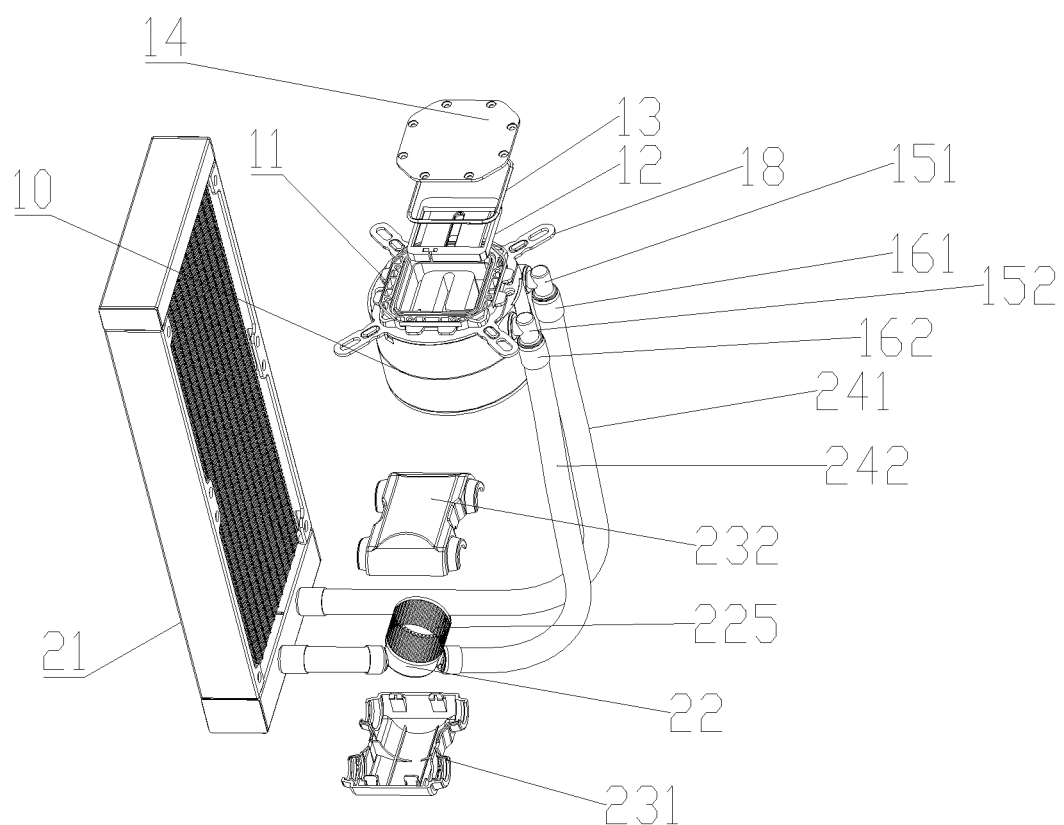
FIG. 1 is a schematic structural perspective view of the overall device according to the present invention.

in which:

10: outer shell; 101: transparent cover plate; 102: upper mirror surface; 103: upper aluminum cover; 104: transparent light guide member; 105: middle decorative plate; 106: lower mirror cover; 107: LOGO bracket; 108: lower cover; 109: PCB board; 11: bottom shell; 111: water passage groove; 112: water partition plate; 113: liquid outlet; 114: liquid inlet; 115: second boss; 116: first boss; 117: limiting bump; 118: liquid inlet pipe; 119: liquid outlet pipe; 12: water path cover plate; 121: placement groove; 122: first water passage hole; 123: second water passage hole; 124: limiting groove; 1111: first water cavity; 1112: second water cavity; 1113: third water cavity; 13: seal ring; 14: heat adsorption soleplate; 141: heat sink set; 151: first adapter; 152: second adapter; 161: first pipe sleeve; 162: second pipe sleeve; 17: connector seal ring; 18: arc-shaped bracket; 21: heat radiation water manifold; 22: pump; 221: driving motor; 222: impeller pipe; 223: impeller; 224: water pump three-way pipe; 225: anti-vibration sleeve; 231: lower cover; 232: upper cover; 241: first braided pipe; and, 242: second braided pipe.

DETAILED DESCRIPTION OF THE INVENTION

With reference to FIGS. 1-9, the present invention relates to a novel water-cooling radiator, including a heat adsorption unit connected to a heat radiation surface of a processor and a heat radiation unit communicated with the heat adsorption unit. The heat adsorption unit includes an outer shell 10, a bottom shell 11, a water path cover plate 12 and a heat adsorption soleplate 14 which are successively connected from top to bottom. A liquid inlet pipe 118 and a liquid outlet pipe 119 both communicated with the heat radiation unit are arranged on the bottom shell 11, and a pump 22 is arranged between the heat radiation unit and the liquid inlet pipe 118. A first water cavity 1111 connected to the liquid inlet pipe 118 and a second water cavity 1112 communicated with the liquid outlet pipe 119 are defined between the bottom shell 11 and the water path cover plate 12, and the first water cavity 1111 and the second water cavity 1112 are independent from each other. A third water cavity 1113 is defined by the heat adsorption soleplate 14 and the water path cover plate 12. A heat sink set 141 is fixedly arranged on a surface of the heat adsorption soleplate 14. The heat sink set 141 is arranged in the third water cavity 1113. A first water passage hole 122 for communicating the first water cavity 1111 with the third water cavity 1113 and second water passage holes 123 for communicating the second water cavity 1112 with the third water cavity 1113 are formed on a surface of the water path cover plate 12. The first water passage hole 122 extends in a direction perpendicular to a lengthwise direction of the heat sink set 142, and the second water passage holes 123 on the water path cover plate 12 are formed at positions corresponding to two ends of the heat sink set 141.

When the cooling liquid enters the first water cavity 1111 from the liquid inlet pipe 118 and then enters the third water cavity 1113 through the first water passage hole 122, and since the heat sink set 141 is arranged in the third water cavity 1113 and the first water passage hole 122 extends in a direction perpendicular to the lengthwise direction of the heat sink set 141, the cooling liquid will enter gaps between multiple heat sinks in the heat sink set 141 and then flow to two ends in the lengthwise direction of the heat sink set 141, subsequently flow into the second water cavity 1112 through the second water passage holes, and then flow to the heat radiation unit through the liquid outlet pipe 119 so as to realize water circulation. Therefore, it is ensured that the cooling liquid can come into contact with multiple heat sinks in the heat sink set 141 to the greatest extent, so that the contact area of the cooling liquid with the heat sink set 141 is increased and the heat radiation effect is improved.

Meanwhile, since the circulation process of the water is from the first water cavity 1111 to the third water cavity 1113 and then to the second water cavity 1112 and the whole water path is first from top to bottom and then from bottom to top, the liquid level of the cooling liquid is certainly higher than the height of the heat sink set 141 to realize water circulation. Therefore, it can be ensured that the cooling liquid completely comes into contact with the heat sink set 141, and the heat radiation effect can be improved.

In the present application, a pump 22 is arranged between the heat radiation unit and the liquid inlet pipe 118. Compared with the conventional pump internally arranged in the heat radiation unit, the pump 22 in the present application is externally connected, so it is more convenient to mount and connect, the performance is more excellent, and it is more convenient for maintenance.

With reference to FIGS. 1-9, the operation process of the present invention is as follows.

The cooling liquid enters the first water cavity 1111 from the liquid inlet pipe 1118 under the drive of the pump 22 and then enters the third water cavity 1113 through the first water passage hole 112, so the cooling liquid will enter gaps between multiple heat sinks in the heat sink set 141 located in the third water cavity 1113 and then flow to two ends of the heat sink set 141 in the lengthwise direction of the heat sink set 141 so as to take away heat from the heat adsorption soleplate 14. Meanwhile, the cooling liquid in the third water cavity 1113 flows into the second water cavity 1112 through the second water passage holes 123 and then flows out from the liquid outlet pipe 119, so that the cooling liquid is delivered to the heat radiation unit for further heat radiation and then circulated into the liquid inlet pipe 118.

Figure 5:
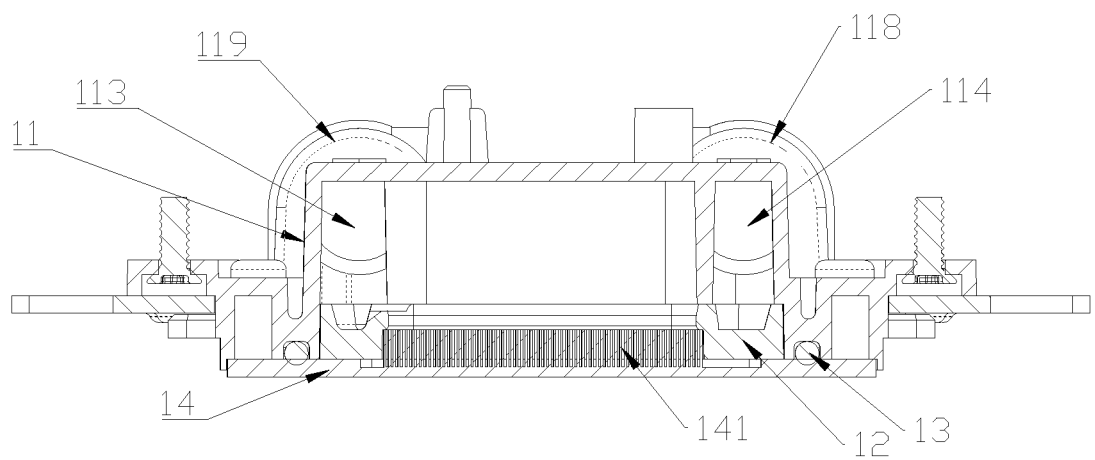
FIG. 5 is a sectional view of the present invention taken along a sectional line E-E in FIG. 3.

With reference to FIG. 5, further, a liquid inlet 114 is formed at a junction of the liquid inlet pipe 118 with the first water cavity 1111, and a liquid outlet 113 is formed at a junction of the liquid outlet 119 with the second water cavity 1112.

Figure 6:
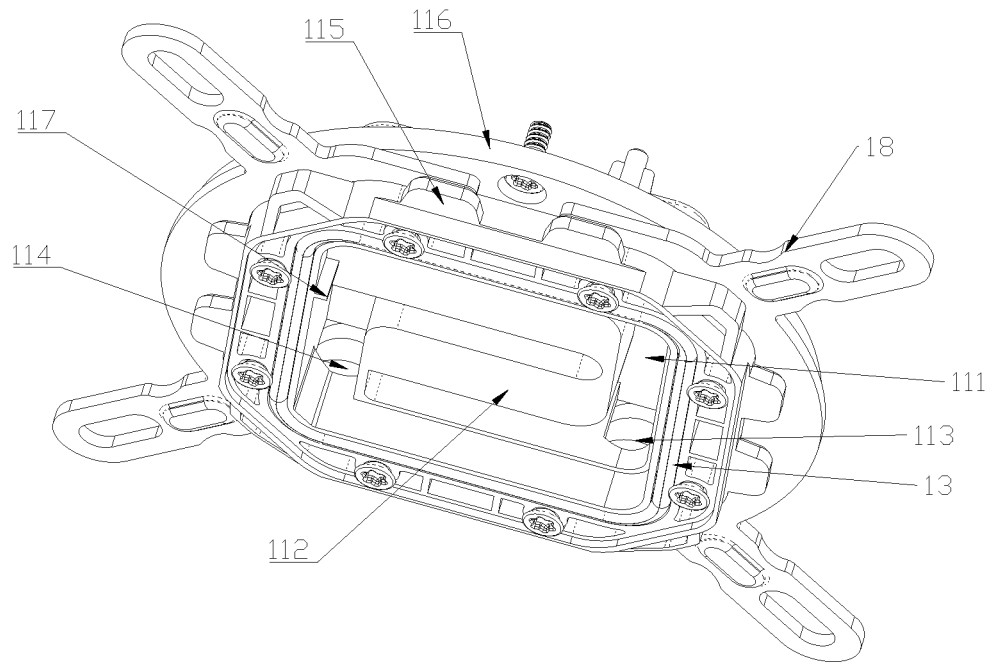
FIG. 6 is a schematic structural perspective view of the bottom shell according to the present invention.
Figure 7:
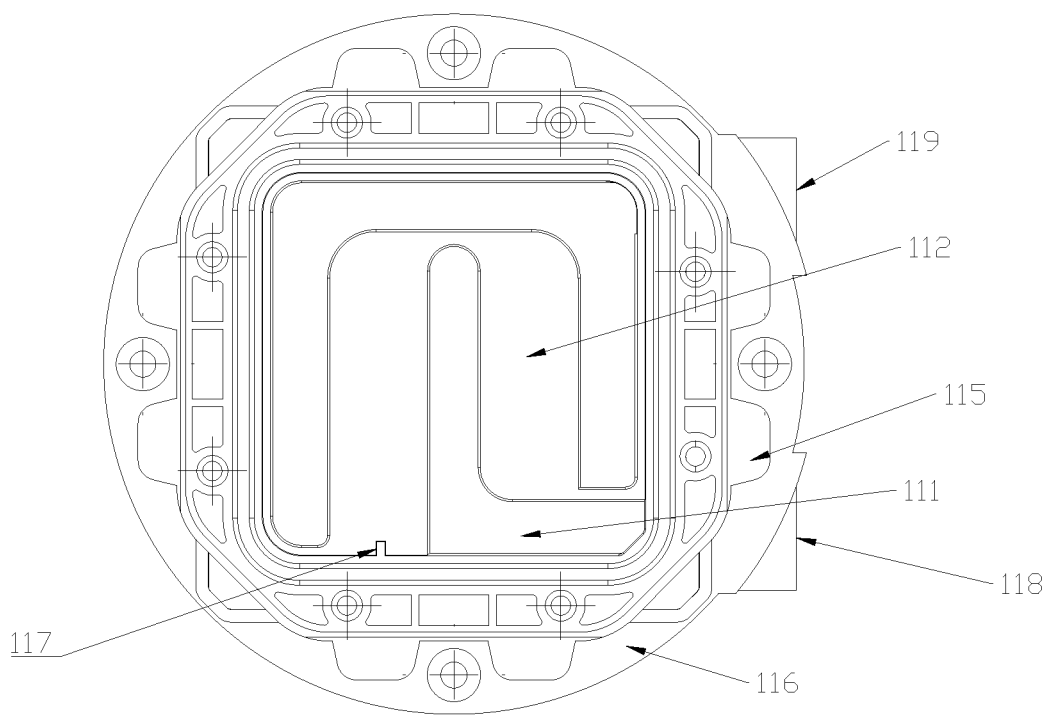
FIG. 7 is a bottom view of the bottom shell according to the present invention.

With reference to FIGS. 6-7, further, a water passage groove 111 is arranged on the bottom of the bottom shell 11, and a U-shaped water partition plate 112 is arranged in the water passage groove 111. The first water cavity 1111 is defined by an inner wall of the water passage groove 111, an inner side face of the water partition plate 112 and the water path cover plate 12, and the second water cavity 1112 is defined by the inner wall of the water passage groove 111, an outer side face of the water partition plate 112 and the water path cover plate 12. In this specific embodiment, the first water cavity 111 is located in the middle of the water passage groove 111 and is L-shaped, and the second water cavity 1112 is U-shaped.

With reference to FIGS. 6-7, further, a limiting bump 117 is arranged on an inner wall of the water passage groove 111, and a limiting groove 124 corresponding to the limiting bump 117 is formed on an outer side face of the water path cover plate 12. The water path cover plate 12 is arranged in the water passage groove 111, and the limiting bump 117 is inserted into the limiting groove 124. In this specific embodiment, by providing the limiting bump 117 on the inner wall of the water passage groove 111, the effect of preventing installation mistake can be achieved. Moreover, the cooperation of the limiting bump 117 with the limiting groove 124 can play a stabilization role, and therefore the water path cover plate 12 can be prevented from deviation during operation.

Figure 8:
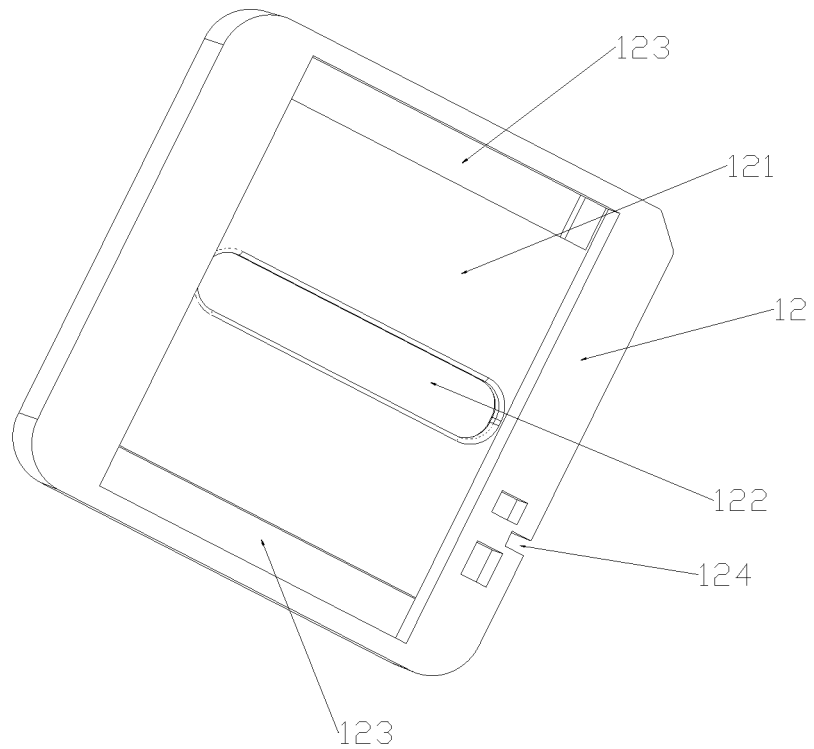
FIG. 8 is a schematic structural perspective view of the water path cover plate according to the present invention.

With reference to FIG. 8, further, a placement groove 121 is formed on a bottom surface of the water path cover plate 12, the heat adsorption soleplate 14 is arranged on the bottom of the water path cover plate 12, and the heat sink set 141 is arranged in the placement groove 121. In order to improve the heat radiation effect of the heat sink set 141, in this specific embodiment, the first passage hole 122 is formed in the middle of the bottom of the placement groove 121 and aligned with the center of the heat sink set 141, so it can be ensured that the amount of the cooling liquid flowing to two ends of the heat sink set 141 is the same, and the occurrence of poor heat radiation effect resulted from unequal amount of the cooling liquid flowing to two ends of the heat sink set 141 is avoided. Meanwhile, the second passage holes 123 are formed on two sides of the bottom of the placement groove 121 and aligned with two ends of the heat sink set 141, so the normal circulation of the water can be ensured. Meanwhile, in this specific embodiment, the depth of the placement groove 121 is equal to the height of the heat sink set 141, that is, the heat sink set 141 is closely adhered to the bottom of the placement groove 121, so it is ensured that the cooling liquid directly enters the gaps of the heat sink set 141 when flowing out from the first passage hole 122. If it is assumed that the heat sink set 141 is not closely adhered to the bottom of the placement groove 121, when the cooling liquid flows out from the first water passage hole 122, the cooling liquid possibly flows to the space between the placement groove 121 and the heat sink set 141. Finally, only a small part of the cooling liquid comes into contact with the heat sink set 141, so the heat radiation effect is reduced.

With reference to FIGS. 4-7, further, a circular seal groove is formed at a junction of the bottom shell 11 with the heat adsorption soleplate 14, and a seal ring 13 is embedded in the seal groove. The seal ring 13 has a cross-sectional area larger than that of the seal groove. Since the cross-sectional area of the seal ring is larger than that of the seal groove, the sealing performance is improved and the liquid leakage probability is reduced.

With reference to FIGS. 4-7, further, the heat adsorption unit further includes an arc-shaped bracket 18. Clamp hooks are arranged at two ends of the arc-shaped bracket 18. A circle of first bosses 116 are formed on an outer side face of the bottom shell, and a plurality of second bosses 115 located below the first bosses 116 are circumferentially arranged at uniform intervals on the outer side face of the bottom shell 11. Clamp grooves corresponding to the clamp hooks are formed on the outer side face of the bottom shell 11 between the first bosses 116 and the second bosses 115. The arc-shaped bracket 18 is clamped between the first bosses 116 and the second bosses 115 and connected to the bottom shell 11 through the hooking connection of the clamp hooks at two ends with the clamp grooves. In this specific embodiment, clamp grooves are provided in four directions of the bottom shell 11. When the arc-shaped bracket 18 is clamped in a space between the first bosses 116 and the second bosses 115, the clamp hooks at two ends of the arc-shaped bracket 18 are hooked with the clamp grooves. Thus, the arc-shaped bracket 18 can be well fixed and engaged with the bottom shell 11, eliminating the tedious structure fixation mode with screws. Moreover, the first bosses 116 and the second bosses 115 play a role of limiting the arc-shaped bracket 18.

Figure 2:
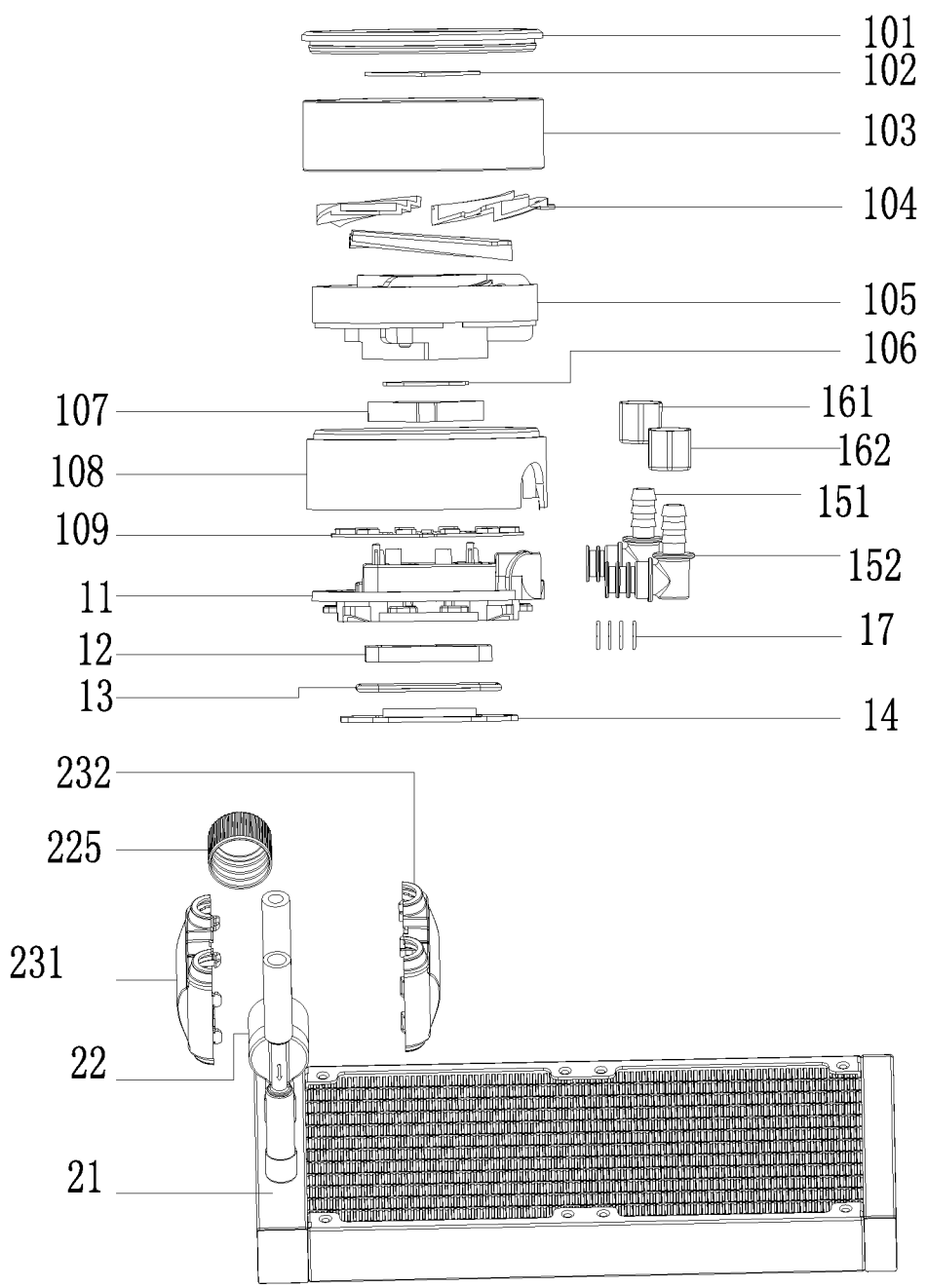
FIG. 2 is an exploded view of the overall device according to the present invention.
Figure 3:
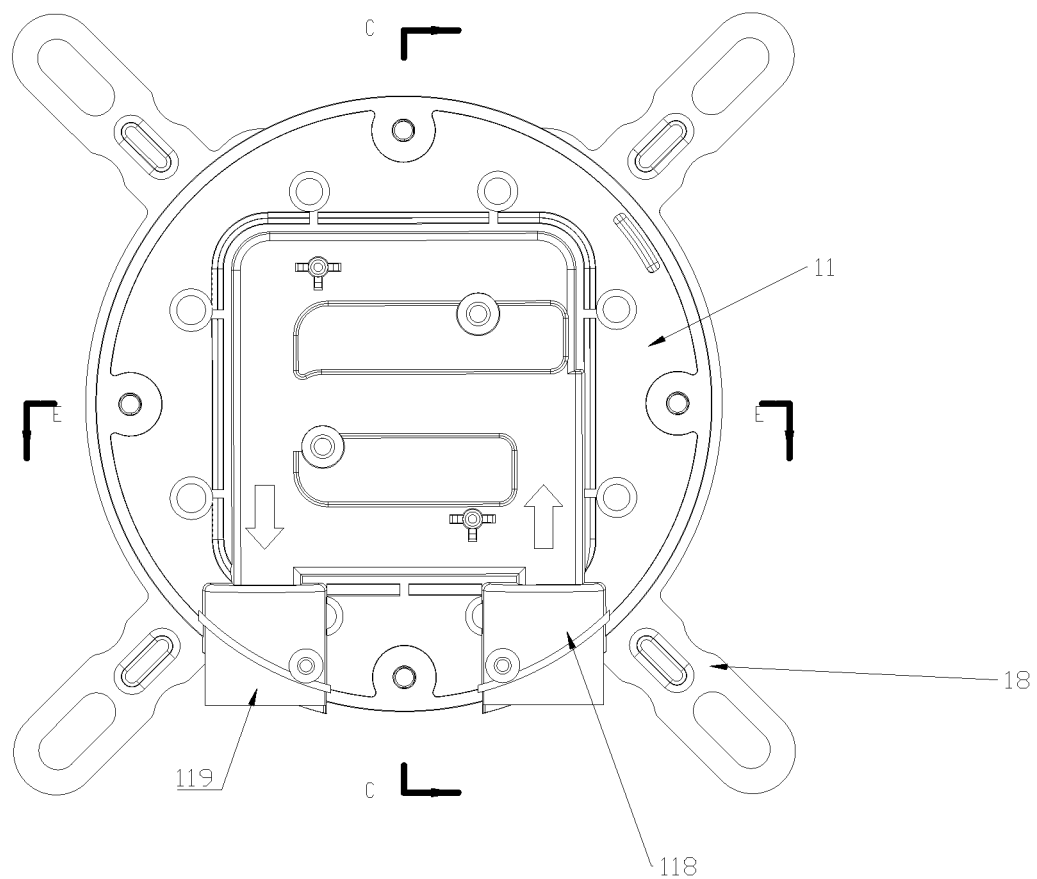
FIG. 3 is a top view of the present invention after a bottom shell, a water path cover plate and a heat adsorption soleplate are assembled.
Figure 4:
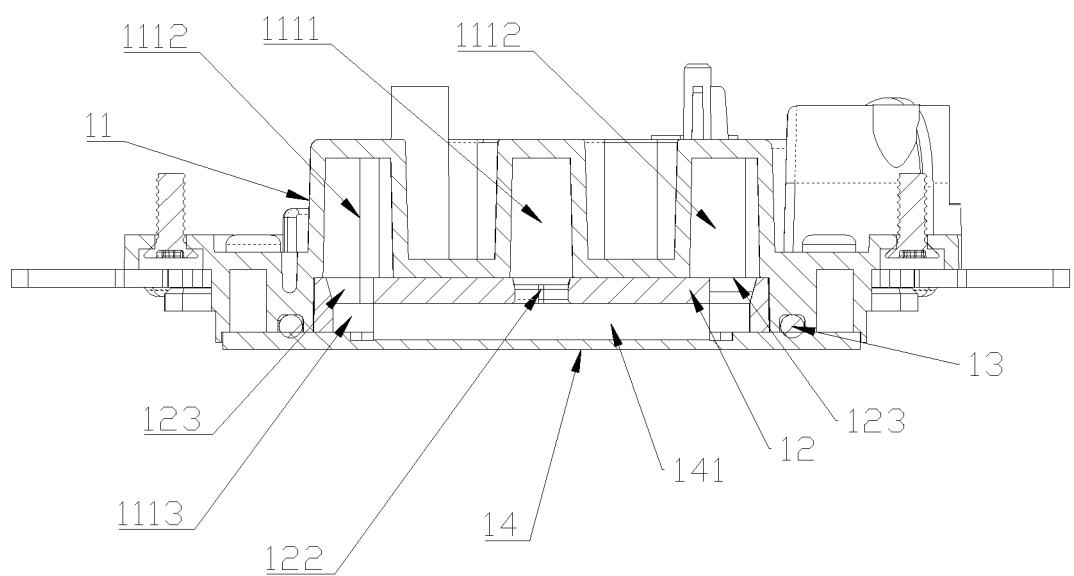
FIG. 4 is a sectional view of the present invention taken along a sectional line C-C in FIG. 3.

With reference to FIGS. 1-2, further, the heat radiation unit includes a heat radiation water manifold 21, a first adapter 151, a second adapter 152, a first pipe sleeve 161, a second pipe sleeve 162, a first braided pipe 241 and a second braided pipe 242. The liquid outlet pipe 119 is communicated with the first adapter 151, the first adapter 151 is communicated with one end of the first braided pipe 241 through the first pipe sleeve 161, and the other end of the first braided pipe 241 is communicated with the heat radiation water manifold 21. The liquid inlet pipe 118 is communicated with the second adapter 152, the second adapter 152 is communicated with one end of the second braided pipe 242 through the second pipe sleeve 162, the other end of the second braided pipe 242 is communicated with a water outlet end of the pump 22, and a water inlet end of the pump 22 is communicated with the heat radiation water manifold 21. Meanwhile, in this specific embodiment, connector seal rings 17 are arranged at a junction of the first adapter 151 with the liquid outlet pipe 119 and a junction of the second adapter 152 with the liquid inlet pipe 118. Thus, the airtightness of the liquid outlet pipe 119 and the liquid inlet pipe 118 can be improved, and the leakage can be avoided.

With reference to FIG. 2, further, the water-cooling radiator further includes a pump cover. The pump cover includes an upper cover 232 and a lower cover 231, and the upper cover 232 and the lower cover 231 are fixed by upper and lower screw-free hooks. The pump 22 is located in a cavity defined by the upper cover 232 and the lower cover 231, and the second braided pipe 242 passes through the cavity to be communicated with the heat radiation water manifold 21.

Figure 9:
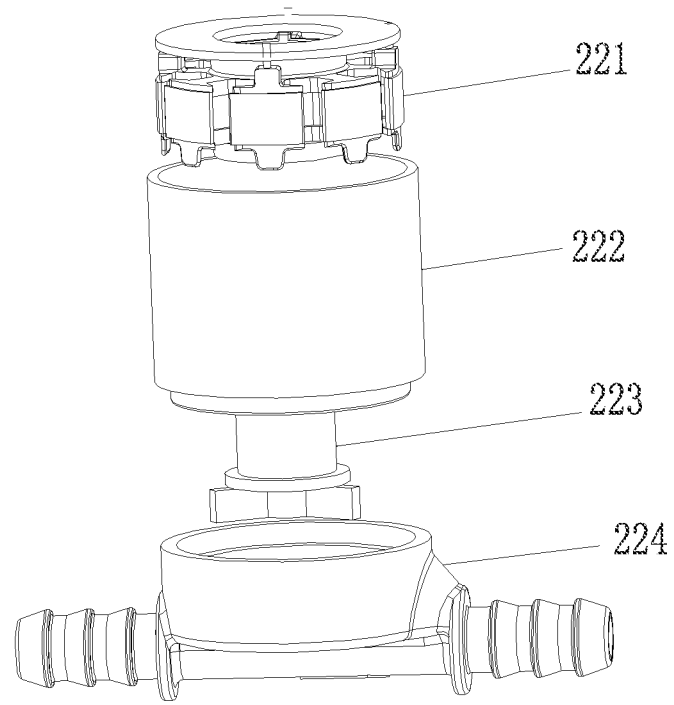
FIG. 9 s a schematic structural view of the pump according to the present invention.

With reference to FIG. 9, in this specific embodiment, the pump 22 includes an impeller pipe 222, a driving motor 221, an impeller 223 and a water pump three-way pipe 224, wherein the impeller pipe 222 is communicated with one end of the water pump three-way pipe 224; both the driving motor 221 and the impeller 223 are arranged in the impeller pipe 222; an output shaft of the driving motor 221 is connected to the impeller 223; the impeller 223 extends into the water pump three-way pipe 224 along its lengthwise direction; and, a water inlet end of the water pump three-way pipe 224 is communicated with the second braided pipe 242, and a water outlet end thereof is communicated with the heat radiation water manifold 21. Furthermore, an anti-vibration sleeve 225 is sheathed on the surface of the impeller pipe 222 to sheath the water pump so as to prevent generation of noise by the operation of the water pump and the vibration of the pump cover.

With reference to FIG. 1, further, the outer shell 10 includes a transparent cover plate 101, an upper mirror surface 102, an upper aluminum cover 103, a transparent light guide member 104, a middle decorative plate 105, a lower mirror cover 106, a LOGO bracket 107, a lower cover 108 and a PCB board 109. The transparent cover plate 101, the upper aluminum cover 103, the middle decorative plate 105 and the lower cover 108 are successively connected from top to bottom, and the lower cover 108 is covered on the surface of the bottom shell 11. Moreover, the upper mirror surface 102 is arranged between the transparent cover plate 101 and the upper aluminum cover 103, the transparent light guide member 104 is arranged between the upper aluminum cover 103 and the middle decorative plate 105, the lower mirror cover 106 and the LOGO bracket 107 are arranged between the middle decorative plate 105 and the lower cover 108, and the PCB board 109 is arranged between the lower cover 108 and the bottom shell 11.

The foregoing implementations are merely for describing the preferred implementations of the present invention, rather than limiting the scope of the present invention. Various transformations and improvements made to the technical solutions of the present invention by a person of ordinary skill in the art without departing from the design spirit of the present invention shall fall into the protection scope defined by the claims of the present invention.

What is claimed is:

1. A water-cooling radiator, comprising a heat adsorption unit connected to a heat radiation surface of a processor and a heat radiation unit communicated with the heat adsorption unit, wherein the heat adsorption unit comprises an outer shell, a bottom shell, a water path cover plate and a heat adsorption soleplate which are successively connected from top to bottom; a liquid inlet pipe and a liquid outlet pipe both communicated with the heat radiation unit are arranged on the bottom shell, and a pump is arranged between the heat radiation unit and the liquid inlet pipe; a first water cavity connected to the liquid inlet pipe and a second water cavity communicated with the liquid outlet pipe are defined between the bottom shell and the water path cover plate; a third water cavity is defined by the heat adsorption soleplate and the water path cover plate; a heat sink set is fixedly arranged on a surface of the heat adsorption soleplate within the third water cavity; a first water passage hole for communicating the first water cavity with the third water cavity and second water passage holes for communicating the second water cavity with the third water cavity are formed on a surface of the water path cover plate; and, the first water passage hole extends in a direction perpendicular to a lengthwise direction of the heat sink set, and the second water passage holes on the water path cover plate are formed at positions corresponding to two ends of the heat sink set;
   wherein a placement groove is formed on a bottom surface of the water path cover plate, the heat adsorption soleplate is arranged on the bottom of the water path cover plate, and the heat sink set is arranged in the placement groove; and, the first passage hole is formed in the middle of the bottom of the placement groove, and the second passage holes are formed on two sides of the bottom of the placement groove.

2. The water-cooling radiator according to claim 1, wherein a liquid inlet is formed at a junction of the liquid inlet pipe with the first water cavity, and a liquid outlet is formed at a junction of the liquid inlet pipe with the second water cavity.

3. The water-cooling radiator according to claim 1, wherein a water passage groove is arranged on the bottom of the bottom shell, and a U-shaped water partition plate is arranged in the water passage groove; the first water cavity is defined by an inner wall of the water passage groove, an inner side face of the water partition plate and the water path cover plate; and, the second water cavity is defined by the inner wall of the water passage groove, an outer side face of the water partition plate and the water path cover plate.

4. The water-cooling radiator according to claim 3, wherein a limiting bump is arranged on an inner wall of the water passage groove, and a limiting groove corresponding to the limiting bump is formed on an outer side face of the water path cover plate; the water path cover plate is arranged in the water passage groove, and the limiting bump is inserted into the limiting groove.

5. The water-cooling radiator according to claim 1, wherein the depth of the placement groove is equal to the height of the heat sink set.

6. The water-cooling radiator according to claim 1, wherein a circular seal groove is formed at a junction of the bottom shell with the heat adsorption soleplate, a seal ring is embedded in the seal groove, and the seal ring has a cross-sectional area larger than that of the seal groove.

7. A water-cooling radiator, comprising a heat adsorption unit connected to a heat radiation surface of a processor and a heat radiation unit communicated with the heat adsorption unit, wherein the heat adsorption unit comprises an outer shell, a bottom shell, a water path cover plate and a heat adsorption soleplate which are successively connected from top to bottom; a liquid inlet pipe and a liquid outlet pipe both communicated with the heat radiation unit are arranged on the bottom shell, and a pump is arranged between the heat radiation unit and the liquid inlet pipe; a first water cavity connected to the liquid inlet pipe and a second water cavity communicated with the liquid outlet pipe are defined between the bottom shell and the water path cover plate; a third water cavity is defined by the heat adsorption soleplate and the water path cover plate; a heat sink set is fixedly arranged on a surface of the heat adsorption soleplate within the third water cavity; a first water passage hole for communicating the first water cavity with the third water cavity and second water passage holes for communicating the second water cavity with the third water cavity are formed on a surface of the water path cover plate; and, the first water passage hole extends in a direction perpendicular to a lengthwise direction of the heat sink set, and the second water passage holes on the water path cover plate are formed at positions corresponding to two ends of the heat sink set;
wherein the heat adsorption unit further comprises an arc-shaped bracket; clamp hooks are arranged at two ends of the arc-shaped bracket; a circle of first bosses are formed on an outer side face of the bottom shell, and a plurality of second bosses located below the first bosses are circumferentially arranged at uniform intervals on the outer side face of the bottom shell; clamp grooves corresponding to the clamp hooks are formed on the outer side face of the bottom shell between the first bosses and the second bosses; and, the arc-shaped bracket is clamped between the first bosses and the second bosses and connected to the bottom shell through the hooking connection of the clamp hooks at the two ends with the clamp grooves.

8. A water-cooling radiator, comprising a heat adsorption unit connected to a heat radiation surface of a processor and a heat radiation unit communicated with the heat adsorption unit, wherein the heat adsorption unit comprises an outer shell, a bottom shell, a water path cover plate and a heat adsorption soleplate which are successively connected from top to bottom; a liquid inlet pipe and a liquid outlet pipe both communicated with the heat radiation unit are arranged on the bottom shell, and a pump is arranged between the heat radiation unit and the liquid inlet pipe; a first water cavity connected to the liquid inlet pipe and a second water cavity communicated with the liquid outlet pipe are defined between the bottom shell and the water path cover plate; a third water cavity is defined by the heat adsorption soleplate and the water path cover plate; a heat sink set is fixedly arranged on a surface of the heat adsorption soleplate within the third water cavity; a first water passage hole for communicating the first water cavity with the third water cavity and second water passage holes for communicating the second water cavity with the third water cavity are formed on a surface of the water path cover plate; and, the first water passage hole extends in a direction perpendicular to a lengthwise direction of the heat sink set, and the second water passage holes on the water path cover plate are formed at positions corresponding to two ends of the heat sink set;
wherein the heat radiation unit comprises a heat radiation water manifold, a first adapter, a second adapter, a first pipe sleeve, a second pipe sleeve, a first braided pipe and a second braided pipe; the liquid outlet pipe is communicated with the first adapter, the first adapter is communicated with one end of the first braided pipe through the first pipe sleeve, and the other end of the first braided pipe is communicated with the heat radiation water manifold; and, the liquid inlet pipe is communicated with the second adapter, the second adapter is communicated with one end of the second braided pipe through the second pipe sleeve, the other end of the second braided pipe is communicated with a water outlet end of the pump, and a water inlet end of the pump is communicated with the heat radiation water manifold;
wherein the water-cooling radiator further comprises a pump cover which comprises an upper cover and a lower cover; the pump is located in a cavity defined by the upper cover and the lower cover; and, the second braided pipe passes through the cavity to be communicated with the heat radiation water manifold.

* * * * *